United States Patent [19]

Miura et al.

[11] Patent Number: 5,329,160

[45] Date of Patent: Jul. 12, 1994

[54] SEMICONDUCTOR PACKAGE WITH METALIZED PORTIONS

[75] Inventors: Shinya Miura; Kouzou Kanda; Mitsugu Shirai, all of Hadano, Japan

[73] Assignee: Hitachi, Ltd., Tokyo, Japan

[21] Appl. No.: 833,677

[22] Filed: Feb. 11, 1992

[30] Foreign Application Priority Data

Mar. 1, 1991 [JP] Japan .................................. 3-035850

[51] Int. Cl.⁵ ...................... H01L 23/02; H01L 23/12
[52] U.S. Cl. .................................. 257/710; 257/704; 257/779
[58] Field of Search ...................... 357/81, 68, 74, 67; 257/704, 706, 707, 710, 718, 719, 720, 722, 729, 730, 779

[56] References Cited

U.S. PATENT DOCUMENTS

| | | | |
|---|---|---|---|
| 4,914,551 | 4/1990 | Anchel et al. | 357/81 |
| 4,949,219 | 8/1990 | Moriizumi et al. | 357/81 |
| 4,996,589 | 2/1991 | Kajiwara et al. | 357/81 |
| 5,018,004 | 5/1991 | Okinaga et al. | 357/81 |
| 5,057,909 | 10/1991 | Mok et al. | 357/81 |
| 5,168,344 | 12/1992 | Ehlert et al. | 257/704 |

FOREIGN PATENT DOCUMENTS 58-68951 4/1983 Japan ................................. 257/704
3-276665 12/1991 Japan ................................. 257/704

Primary Examiner—Rolf Hille
Assistant Examiner—S. V. Clark
Attorney, Agent, or Firm—Fay, Sharpe, Beall, Fagan, Minnich & McKee

[57] ABSTRACT

In a semiconductor package in which a cover and a substrate are combined with each other in a sealed state, metallized portions consisting of a material of a high solder wettability are provided on the joint surface, which is opposed to the substrate, of the cover, outer side surfaces of the cover, and the portions of the inner side surfaces of the cover which are in the vicinity of the joint surface. These metallized portions are formed so that the height thereof on the outer side surfaces of the cover is larger than that on the inner side surfaces thereof. The metallized portions on the outer side surfaces are formed so that the height thereof at the corner portions of the cover is larger than that at the intermediate portions of the four sides thereof, and the metallized portions on the inner side surfaces are formed so that the height thereof at the intermediate portions of the four sides of the cover is larger than that at the corner portions thereof. This enables the excess and shortage of solder supplied to the joint portions of the substrate and cover constituting the semiconductor package to be prevented.

5 Claims, 2 Drawing Sheets

SEMICONDUCTOR PACKAGE WITH METALIZED PORTIONS

BACKGROUND OF THE INVENTION

This invention relates to a semiconductor package, and more particularly to a semiconductor package having an improved shape of a metallized portion of the cover for sealing the semiconductor element mounted on a ceramic substrate.

An air-tightly sealed semiconductor package for use in computers usually includes a cover consisting of a material of a high thermal conductivity brazed or soldered to a ceramic substrate, on which a semiconductor element, such as an LSI circuit chip is mounted. Such air-tightly sealed semiconductor packages include, for example, a semiconductor package disclosed in Japanese Patent Laid-Open No. 276237/1986.

The sealing of a semiconductor element on a ceramic substrate is done by soldering in advance a joint portion of a metallized ceramic substrate and that of a cover, or by placing a solder foil or a wire rod on a joint portion of a ceramic substrate, aligning the ceramic substrate and cover with each other, and heating the resultant ceramic substrate and cover so as to melt the solder.

According to a conventional method of producing a semiconductor package of this kind, only the opposed joint surfaces of the joint portions of the ceramic substrate and cover are generally subjected to a metallization treatment.

SUMMARY OF THE INVENTION

In a ceramic substrate, which is generally formed by a sintering method, flexure occurs under certain sintering conditions. If a substrate suffers from such flexure, the clearance between the substrate and a cover cannot be made uniform. According to the conventional techniques, only the joint surface only of a cover is metallized. Therefore, when a substrate is warped, the portion of the metallized surface of the cover which has a larger clearance with respect to the substrate has an insufficient solder retaining force. Consequently, it becomes difficult to secure a sufficient quantity of solder, and a package sealing operation cannot be satisfactorily carried out. The inventors of the present invention has discovered that there is the possibility that such an unsatisfactory seal may cause a seal gas contained in the package to leak.

When a cover is joined to a ceramic substrate, surface tension works on the molten solder so that the solder has the smallest possible surface area and a stable shape. Moreover, a semiconductor package, and the joint portions of a substrate and a cover are generally square. Accordingly, surface tension works so that the molten solder gathers at the inner side of the corner portions of the cover. However, according to the conventional techniques mentioned above, no consideration is given to the surface tension working on the molten solder when a cover is joined to a ceramic substrate. Therefore, the solder does not spread uniformly over the joint portion, but collects on the inner side of the corner portions of the cover. Consequently, the outer sides of the corner portions of the cover and the inner sides of the intermediate portions of the four sides thereof may lack sufficient solder to prevent a seal gas contained in the semiconductor package from leaking from the intermediate portions of the four sides thereof, and the solder may project from the corner portions of the package into the interior thereof. The inventors of the present invention have discovered that these troubles cause the inner wires to be short-circuited.

An object of the present invention is to provide a highly reliable semiconductor package free from the local excess and shortage of solder supplied to the joint portions of a substrate and a cover in the semiconductor package, and capable of securing the supply of a suitable quantity of solder to the whole of the joint portions, thus and preventing the imperfect sealing of the package which is ascribable to the local shortage of solder, or the short-circuiting of the inner wires which is ascribable to the local excess of solder.

In order to achieve this object, metallized portions of a high wettability are formed according to the present invention on the joint surface of the cover opposed to a substrate and the portions of the outer and inner side surfaces of the cover which are in the vicinity of the joint surface thereof. Since the welding metallized portions are thus formed not only on the joint surface, which is opposed to the substrate, of the joint portion of the cover to be fixed to the substrate, but also on the inner and outer side surfaces of the cover, the solder retaining force can be increased to a high level in each part of the joint portion of the cover. Even when the flexure of the substrate is large, creating a clearance between the substrate and cover, the solder can be secured sufficiently.

The metallized portions on the inner side surfaces of the cover are formed so that the average height thereof becomes larger than the average height of the metallized portions on the outer side surfaces of the cover.

This enables the solder retaining force of the inner surfaces of the cover to be increased, and helps to prevent the shortage of solder on the inner surfaces of the package, which causes the imperfect sealing of the package.

The metallized portions on the outer side surfaces of the cover are formed so that the height thereof at the corner portions of the cover is larger than the height thereof at the laterally intermediate portions of the side walls of the cover. The metallized portions on the inner side surfaces of the cover are formed so that the height thereof at the laterally intermediate portions of the side walls of the cover is larger than the height thereof at the corner portions of the cover. Accordingly, the unbalanced gathering of solder, which is ascribed to the surface tension working on the molten solder during a package sealing operation, can be prevented, and a suitable quantity of solder can be secured on the joint portions of the substrate and cover.

BRIEF DESCRIPTION OF THE DRAWINGS

FIG. 3 illustrates a cover for a semiconductor package according to the present invention, wherein:

FIG. 4 illustrates another example of a cover for a semiconductor package constructed according to the present invention, wherein:

FIG. 5 illustrates still another example of a cover for a semiconductor package constructed according to the present invention, wherein:

DESCRIPTION OF THE PREFERRED EMBODIMENTS

The embodiments of the present invention will now be described with reference to the drawings.

Figure 1:
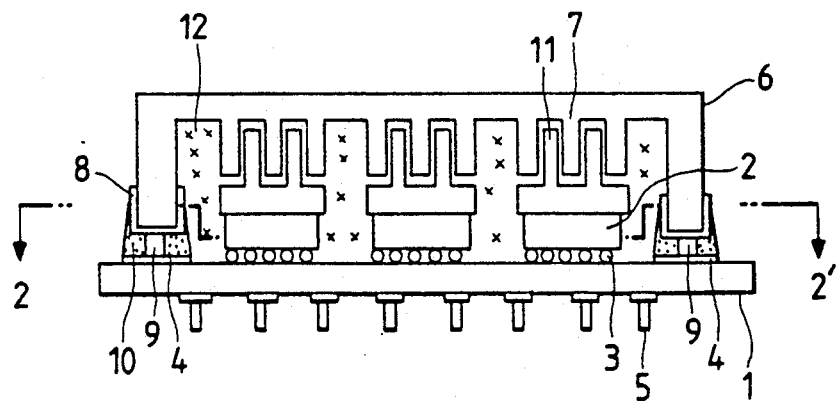
FIG. 1 is a sectional view of an embodiment of a semiconductor package constructed according to the present invention.
Figure 2:
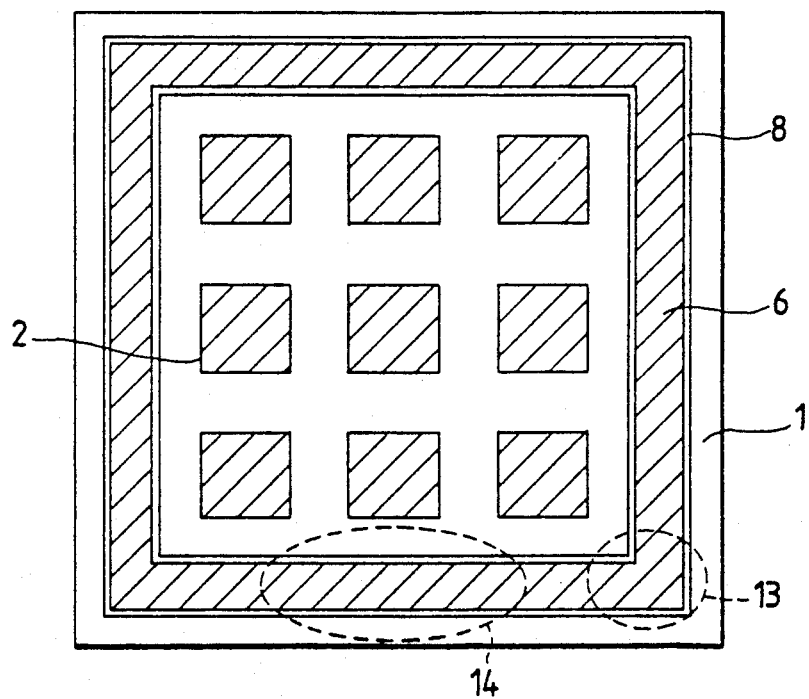
FIG. 2 is a sectional view taken along the line 2—2' in FIG. 1.

FIG. 1 is a sectional view of an embodiment of the semiconductor package according to the present invention, and FIG. 2 a sectional view taken from the upper side of a plane shown by 2—2' in FIG. 1.

A semiconductor element 2, such as an LSI circuit chip, is mounted on a multilayer ceramic substrate 1 formed of a multilayer ceramic material, and this semiconductor element 2 is soldered to a connecting pad 3 on the multilayer ceramic substrate 1. A sealing metallized portion 4 for bonding a cover 6 is formed on a portion of the surface, on which the semiconductor element 2 is mounted, of the multilayer ceramic substrate 1 which is near the element 2, and the cover 6 is fixed at this portion to the substrate 1 with low-melting brazing metal 10. A predetermined gap is provided by a spacer 9 between the joint portions of the multilayer ceramic substrate 1 and cover 6.

To feed power to the semiconductor element 2 or to transfer signals, I/O pins 5 are provided on the other side of the substrate 1, opposite to the side on which the semiconductor element 2 is mounted.

Heat transfer fins 7 are provided on the inner upper surface of the cover 6, and the heat from 10 the semiconductor element 2 is transmitted to the cover 6 via heat transfer parts 11. The inner space, which is sealed with the cover 6, of the semiconductor package is filled with a gas 12 of a high heat conductivity for efficiently transmitting the heat generated by the semiconductor element 2 to the cover.

The portion of the cover 6 which is to be combined with the multilayer ceramic substrate 1 has a sealing metallized portion 8 for keeping this portion capable of being fixed to the solder 10 of a low melting point, in the same manner as the corresponding portion of the multilayer substrate 1. The sealing metallized portions 8 are formed not only on the joint surface, which is opposed to the metallized portion 4 of the multilayer ceramic substrate 1, of the cover 2, but also on the portions of the inner and outer side surfaces of the cover 6 which are in the vicinity of the joint surface.

Since the sealing metallized portions 8 of the cover 6 are thus formed not only on its joint surface but also on its inner and outer side surfaces, the surface area of the metallized portions per unit length of the joint portion becomes large, and the solder retaining force of the sealing metallized portions can be increased. Consequently, when the multilayer ceramic substrate 1 is warped, causing a clearance between the joint portions of the multilayer ceramic substrate 1 and cover 6 to become large, a sufficient quantity of solder can be secured at such a clearance portion, and the imperfect package sealing caused by the lack of solder can be prevented. Further, the average height of the metallized portions formed on the inner side surfaces is increased, the shortage of solder on the inner side of the joint portion, which also leads to the imperfect sealing of the package, can be prevented more effectively.

The shape of the metallized portion 8 will not be described with reference to FIG. 3. Metallized portion 8 is effective in preventing the shortage of solder at the outer side of a corner portion 13 or at the inner side of an intermediate portion of a side of the cover 6 shown in FIG. 2, which shortage occurs when the molten solder gathers at the inner side of the corner portion 13 due to the surface tension of the molten solder during a package sealing operation for joining the multilayer ceramic substrate 1 and cover 6.

Figure 3A:
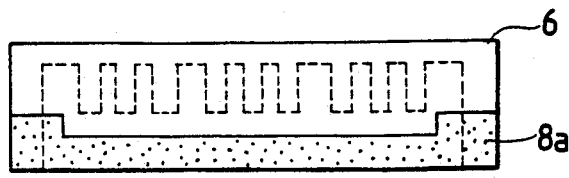
FIG. 3a is a side elevation of an outer portion of the cover.
Figure 3B:
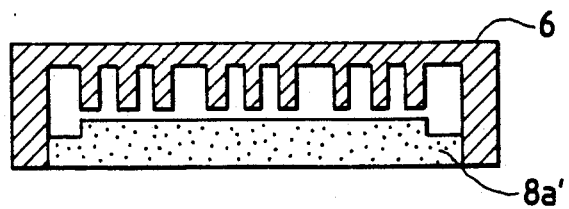
FIG. 3b is a side elevation of an inner portion thereof.

FIG. 3a shows an outer side surface of a cover 6, and FIG. 3b an inner side surface of the cover 6. For convenience's sake, FIG. 3 illustrates a cover 6 which has yet to be bonded to a multilayer ceramic substrate 1.

As shown in FIG. 3a, a sealing metallized portion 8a is also formed by a plating treatment on the portion of the cover 6 which is in the vicinity of the joint surface on the outer side thereof. The sealing metallized portion 8a is formed so that the height thereof at the corner portion 13 is larger than that at the intermediate portion 14 of FIG. 2. The cover 6 has at the inner side surfaces as well a sealing metallized portion 8a', which is formed by a plating treatment, as shown in FIG. 3b just as the sealing metallized portion on the outer side surfaces thereof. Contrary to the outer side surfaces of the cover 6, the inner side surfaces thereof have a sealing metallized portion 8a formed so that the height of the intermediate portion 14 is larger than that of the corner portion 13.

If the metallized portion is formed to such a shape, the solder retaining force can be increased, especially at the inner side of the intermediate portions 14 of the cover 6 and at the outer side of the corner portions 13 thereof. Accordingly, the molten solder can be supplied excessively to the inner side of the corner portions 13 of the cover 6 and to the intermediate portions of the four sides thereof during a package sealing operation due to the surface tension, so that the shortage of solder at the inner side of the intermediate portions of the four sides of the cover and at the outer side of the corner portions 13 thereof can be prevented. Therefore, a suitable quantity of solder can be supplied uniformly to each part of the joint portions of the multilayer ceramic substrate 1 and cover 6.

FIGS. 4 and 5 are a side elevation and an inner side elevation respectively of a cover 6 in another embodiment of the present invention.

Figure 4A:
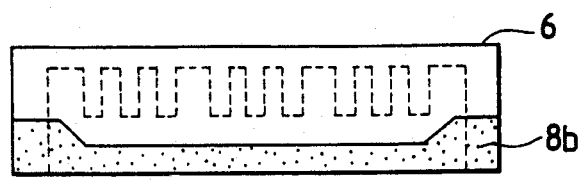
FIG. 4a is a side elevation of an outer portion of the cover.
Figure 4B:
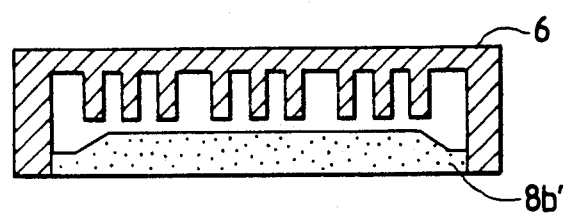
FIG. 4b is a side elevation of an inner portion thereof.
Figure 5A:
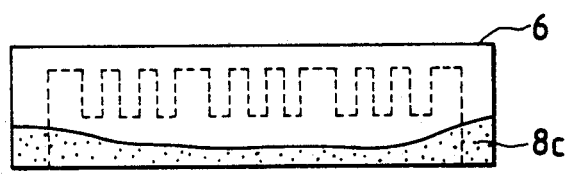
FIG. 5a is a side elevation of an outer portion of the cover.
Figure 5B:
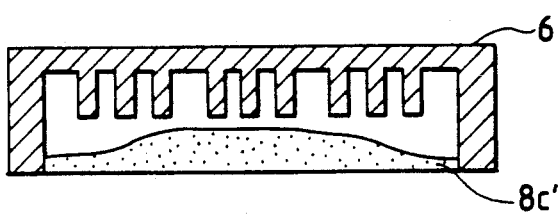
FIG. 5b is a side elevation of an inner portion thereof.

The embodiment of FIGS. 4 and 5 also has, at the outer side of the cover 6, sealing metallized portions 8b, 8c in which the height of the corner portions is larger than that of the intermediate portions of the four sides thereof as shown in FIGS. 4a and 5a and, at the inner side of the cover 6, sealing metallized portions 8b', 8c' in which the height of the intermediate portions of the four sides thereof is larger than that of the corner portions thereof as shown in FIGS. 4b and 5b, the conditions of the formation of these metallized portions being similar to those of the embodiment of FIG. 3. Especially, it should be noted that the sealing metallized portions are formed so that the height of the corner portions and that of the intermediate portions of the four sides vary continuously. The metallized portions having such a shape permit solder to be supplied neither too much nor too little to the joint portions of the multilayer ceramic substrate 1 and cover 6 just as for the metallized portions having the shape shown in FIG. 3.

The above is a description of particular embodiments of the present invention with reference to the drawings thereof. The structure of the metallized portions on the joint portions of the substrate and cover is not limited to those described in these embodiments; various types of structures not departing from the scope of the gist of the present invention can, of course, be employed.

According to the present invention, metallized portions are formed on the inner and outer side surfaces of a cover for a semiconductor package, so that a sufficient quantity of solder can be secured on the joint portions of a substrate and the cover. Since a metallized portion having a suitable level of solder retaining force is formed on each part of the joint portions taking into consideration the surface tension working on the molten solder during a package sealing operation, the solder on the joint portions does not gather locally. This enables a highly reliable semiconductor package capable of preventing the imperfect sealing thereof and the short-circuiting of the inner wires which occur due to the excess or shortage of solder.

We claim:

1. A semiconductor package comprising an electronic part on a substrate and a cover brazed to the substrate to seal the electronic part, said cover having inner and outer side surfaces, characterized in that a joint surface of said cover that is opposed to the substrate and portions of the outer and inner side surfaces of said cover which are in the vicinity of said joint surface have metallized portions of a high solder wettability, said joint surface being defined as a surface of said cover that fixedly contacts said substrate, wherein the height dimension of the metallized portions formed on said inner side surfaces is greater than that of the metallized portions formed on said outer side surfaces.

2. A semiconductor package comprising an electronic part on a substrate and a cover brazed to the substrate to seal the electronic part, said cover having inner and outer side surfaces, characterized in that a joint surface of said cover that is opposed to the substrate and portions of the outer and inner side surfaces of said cover which are in the vicinity of said joint surface have metallized portions of a high solder wettability, said joint surface being defined as a surface of said cover that fixedly contacts said substrate, wherein the metallized portions on said outer side surfaces are formed so that the height thereof at corner portions of said cover is greater than that at intermediate portions of the outer side surfaces thereof, defined between consecutive corners of the cover, the metallized portions on said inner side surfaces being formed so that the height thereof at intermediate portions of the inner side surfaces, defined between consecutive corners of said cover, is greater than that at the corner portions of said inner side surfaces.

3. A semiconductor package according to claim 2, wherein the metallized portions on said outer side surfaces are formed so that the height thereof gradually increases from the outer side portions of said cover toward corner portions thereof, the metallized portions on said inner side surfaces being formed so that the height thereof gradually increases from corner portions of said cover toward the inner side portions thereof.

4. A semiconductor package according to claim 2, wherein the metallized portions on said outer side surfaces are formed so as to extend flat at the outer side portions of said cover and gradually higher therefrom toward positions in the vicinity of corner portions thereof, the metallized portions of said inner side surfaces being formed so as to extend flat at the inner side portions of said cover, and gradually lower therefrom toward positions in the vicinity of corner portions thereof, and flat at said corner portions.

5. A semiconductor package comprising an electronic part on a substrate and a cover brazed to the substrate to seal the electronic part, said cover having inner and outer side surfaces, characterized in that a joint surface of said cover that is opposed to the substrate and portions of the outer and inner side surfaces of said cover which are in the vicinity of said joint surface have metallized portions of a high solder wettability, said joint surfaces being defined as a surface of said cover that fixedly contacts said substrate, wherein the metallized portions on said outer side surfaces are formed so that the height thereof is greater at corner potions oft he outer side surfaces than the average height of the metallized portions at an intermediate portions of the outer side surfaces, defined between consecutive corners of said cover, and wherein the metallized portions on said inner side surfaces are formed so that the average height thereof is greater at an intermediate portion, defined between consecutive corners of said cover, than the height of the metallized portions at corner portions of said inner side surfaces.

* * * * *